United States Patent
Babitch et al.

(10) Patent No.: US 9,176,234 B2
(45) Date of Patent: *Nov. 3, 2015

(54) SYSTEMS AND METHODS FOR MANAGING POWER CONSUMPTION

(75) Inventors: Daniel Babitch, San Jose, CA (US); Steven A. Gronemeyer, Cedar Rapids, IA (US); Peter Naji, Tempe, AZ (US)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 874 days.

This patent is subject to a terminal disclaimer.

(21) Appl. No.: 13/427,895

(22) Filed: Mar. 23, 2012

(65) Prior Publication Data

US 2012/0184236 A1    Jul. 19, 2012

Related U.S. Application Data

(63) Continuation of application No. 12/414,406, filed on Mar. 30, 2009, now Pat. No. 8,185,083.

(51) Int. Cl.

| H04B 1/16 | (2006.01) |
|---|---|
| G01S 19/34 | (2010.01) |
| G01S 19/23 | (2010.01) |
| H04B 1/30 | (2006.01) |

(Continued)

(52) U.S. Cl.
CPC ................ *G01S 19/34* (2013.01); *G01S 19/23* (2013.01); *H03D 3/004* (2013.01); *H03J 7/04* (2013.01); *H04B 1/1607* (2013.01); *H04B 1/30* (2013.01); *H04L 7/0008* (2013.01)

(58) Field of Classification Search
CPC .......... H04B 1/1607; H04B 1/30; H04B 1/26; H03D 3/004; H03J 7/04; G01S 19/235; H04L 7/0008
USPC ........... 455/343.1, 343.4, 208, 265, 255, 257, 455/258, 259, 574; 375/354, 324, 149, 150, 375/152; 701/213

See application file for complete search history.

(56) References Cited

U.S. PATENT DOCUMENTS

| 5,629,708 A | 5/1997 | Rodal et al. |
| 5,864,315 A | 1/1999 | Welles, II |

(Continued)

FOREIGN PATENT DOCUMENTS

| EP | 1462885 | 9/2004 |
| WO | 03038464 A3 | 5/2003 |

(Continued)

*Primary Examiner* — Joseph Lauture

(74) *Attorney, Agent, or Firm* — Mahamedi Paradice LLP

(57) ABSTRACT

GPS navigation devices or GPS receivers can consume less power by using a temperature recorder circuit and/or a power manager in maintaining the accuracies of the GPS receiver time and reference frequency to improve battery life. A representative receiver includes a time reference device and the temperature recorder circuit that operate while the receiver hibernates. The time reference device generates clock signals and the temperature recorder circuit receives and operates using the clock signals from the time reference device. The temperature recorder senses the temperature of the time reference device. The temperature recorder circuit is designed to send a wake-up signal to at least one electrical component of the receiver to wake up the electrical component of the receiver. The electrical component of the receiver includes at least one of the following: a GPS signal processing system and a frequency reference device.

25 Claims, 5 Drawing Sheets

(51) Int. Cl.
*H04L 7/00* (2006.01)
*H03J 7/04* (2006.01)
*H03D 3/00* (2006.01)

(56) References Cited

U.S. PATENT DOCUMENTS 6,985,811 B2 * 1/2006 Gronemeyer .................. 701/469
8,185,083 B2 * 5/2012 Babitch et al. ............. 455/343.1

FOREIGN PATENT DOCUMENTS

| WO | WO03038464 | A2 | 5/2003 |
| WO | WO03038464 | A3 | 5/2003 |
| WO | 03050558 | A2 | 6/2003 |
| WO | 2005001388 | A2 | 1/2005 |
| WO | WO2007076541 | A2 | 7/2007 |
| WO | WO2007076541 | A3 | 7/2007 |

* cited by examiner

SYSTEMS AND METHODS FOR MANAGING POWER CONSUMPTION

CROSS REFERENCE TO RELATED APPLICATIONS

This application is continuation of copending U.S. utility application entitled, "SYSTEMS AND METHODS FOR MANAGING POWER CONSUMPTION," having Ser. No. 12/414,406, filed on Mar. 30, 2009, which is entirely incorporated herein by reference.

TECHNICAL FIELD

The present disclosure is generally related to global positioning system (GPS) technology and, more particularly, is related to systems and methods for managing power consumption.

BACKGROUND

Today, it is important to consumers that portable devices have a long battery life. Many portable devices include GPS receivers that enable the consumers to navigate from one place to another. GPS acquisition performance is typically limited by four items of information:
 a) The accuracy of a reference frequency on a GPS receiver
 b) The accuracy of the GPS receiver time relative to GPS system time
 c) Availability of currently valid Ephemeris information (high precision satellite orbital parameters.)
 d) The accuracy of an initial position estimate of the GPS receiver GPS navigation devices consume a fair amount of power to realize high speed GPS acquisition performance, resulting in shorter battery life for GPS devices. Currently, the available techniques for improving the above items a) and b) are limited with respect to power consumption.

For example, the reference frequency often comes from a temperature compensated crystal oscillator (TCXO) in most GPS receivers. The TCXO typically runs when the GPS receiver is running and not when the GPS receiver hibernates because the TCXO can use too much power if it is left always on. It is a much more accurate frequency reference than a real time clock (RTC) crystal oscillator. But since the TCXO cannot be left always on, the TCXO cannot be used for a time reference, because when the power is off, a time counter using that reference frequency would stop. The RTC crystal oscillator is typically used as a time reference for the above reasons, among others.

Currently, the accuracy of time from the RTC crystal oscillator is typically limited by unknown frequency excursions, among other factors. Such unknown frequency excursions are typically dominated by temperature changes at the RTC crystal oscillator, during the time when the RTC crystal oscillator cannot otherwise be calibrated to a more accurate time reference because the GPS is shut off (in hibernate mode) to save battery power. If an external source of time is available, such as from a radio network, then the time accuracy is limited to the accuracy of the network source. Sometimes the network time is not available, or not very accurate for the purpose of this application.

The knowledge of the reference frequency is typically limited by the accuracy and environmental (temperature) stability of the reference TCXO. Frequency can also be derived from some network radio receivers, but this may not be quick, easy to implement, accurate, or even available.

SUMMARY

GPS navigation devices or GPS receivers can consume less power by using a temperature recorder circuit and/or a power manager in maintaining the accuracies of the GPS receiver time and reference frequency to improve battery life. A representative receiver includes a time reference device and the temperature recorder circuit that operate while the receiver hibernates. The time reference device generates clock signals and the temperature recorder circuit receives and operates using the clock signals from the time reference device. The temperature recorder senses the temperature of the time reference device. The temperature recorder circuit is designed to send a wake-up signal to at least one electrical component of the receiver to wake up the electrical component of the receiver. The electrical component of the receiver includes at least one of the following: a GPS signal processing system and a frequency reference device.

Other systems, devices, methods, features of the invention will be or will become apparent to one skilled in the art upon examination of the following figures and detailed description. It is intended that all such systems, methods, features be included within the scope of the invention, and be protected by the accompanying claims.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, the reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

Figure 1:
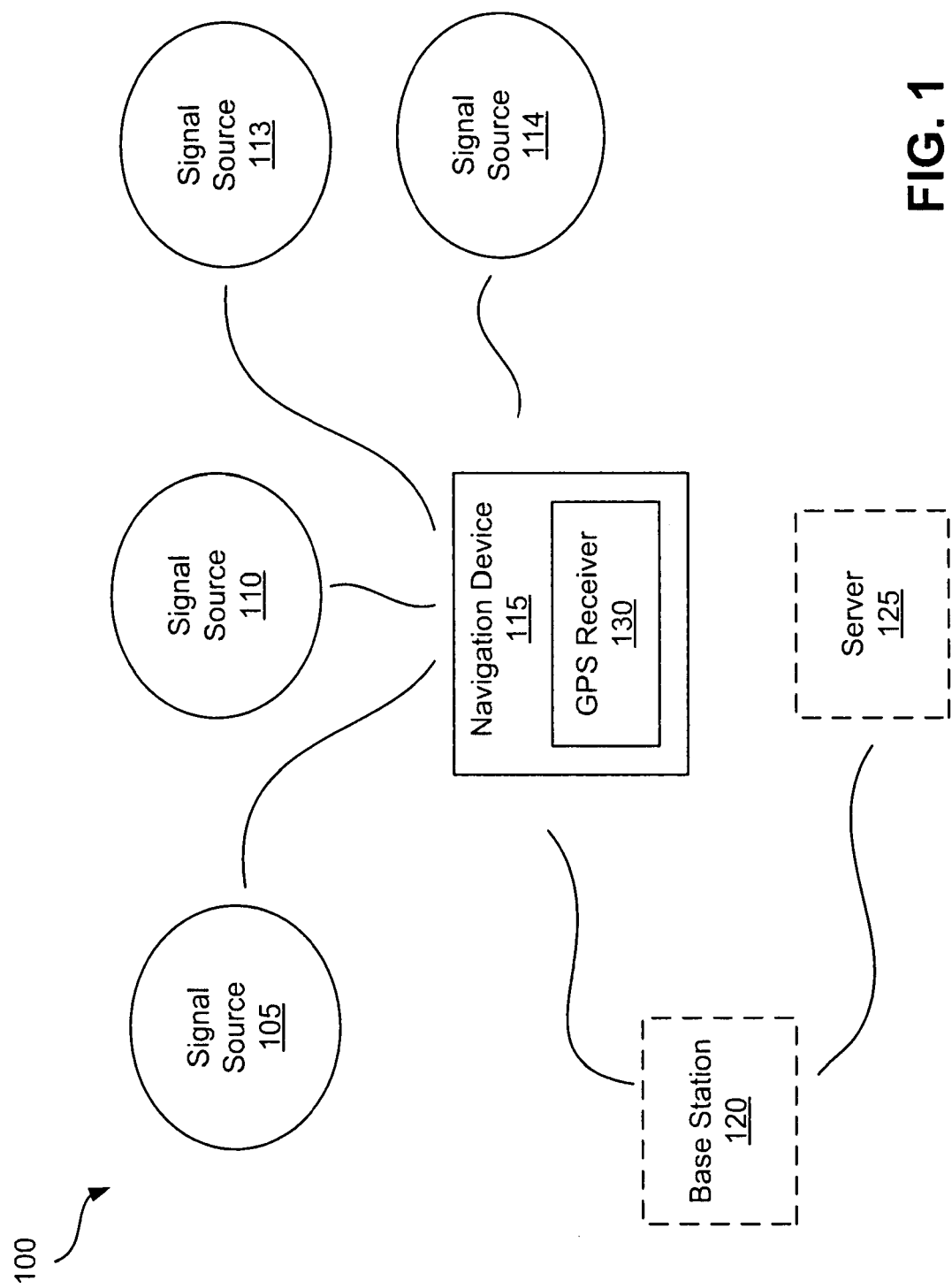
FIG. 1 is a block diagram that illustrates a system having a global positioning system (GPS) navigation device that improves accuracies of the GPS receiver time and the reference frequency while conserving power consumption using a temperature recorder circuit and a power manager.
Figure 3:
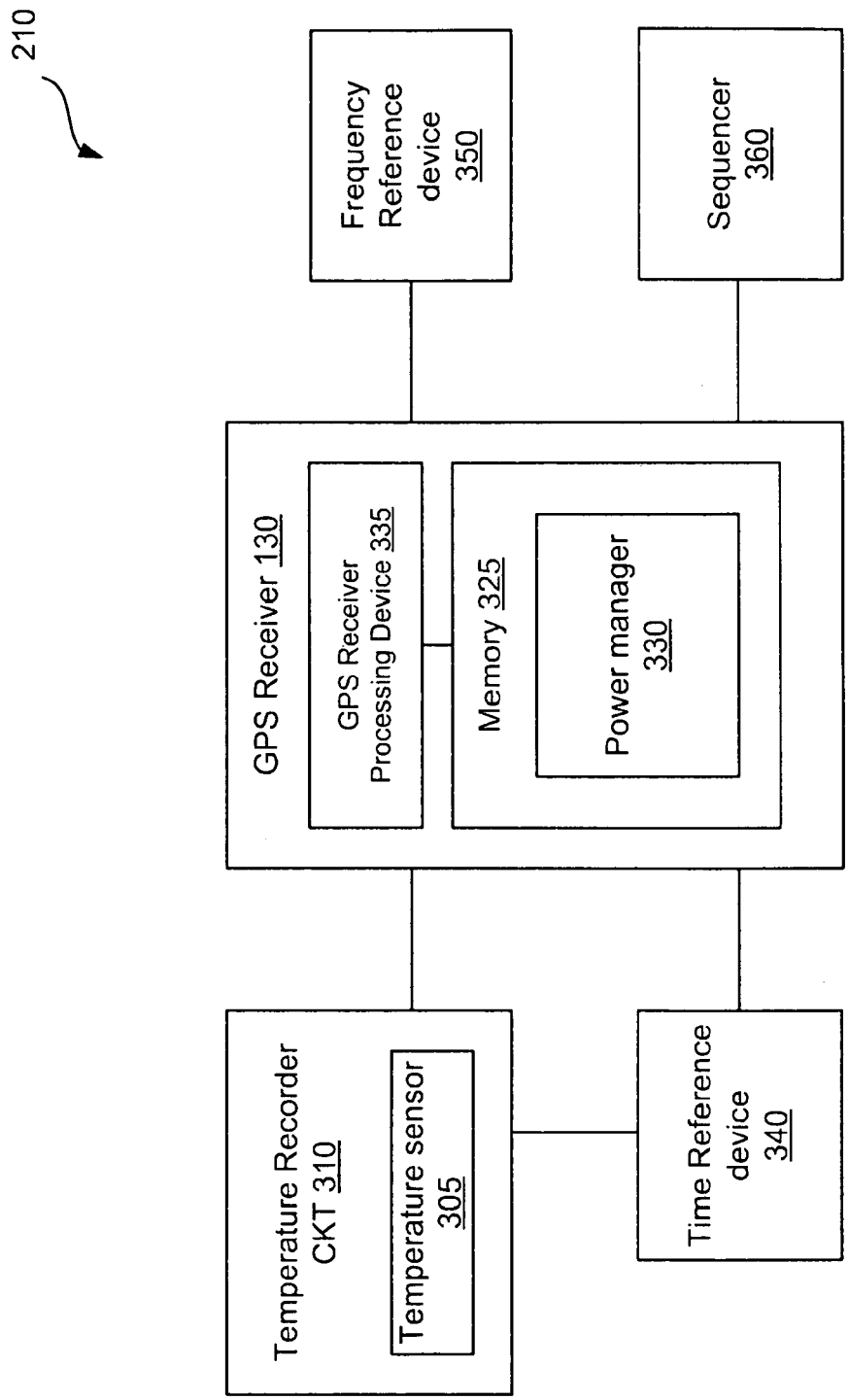
FIG. 3 is a block diagram that illustrates an embodiment of a GPS signal processing system, such as that shown in FIG. 2, which includes a temperature recorder circuit and a power manager.
Figure 4:
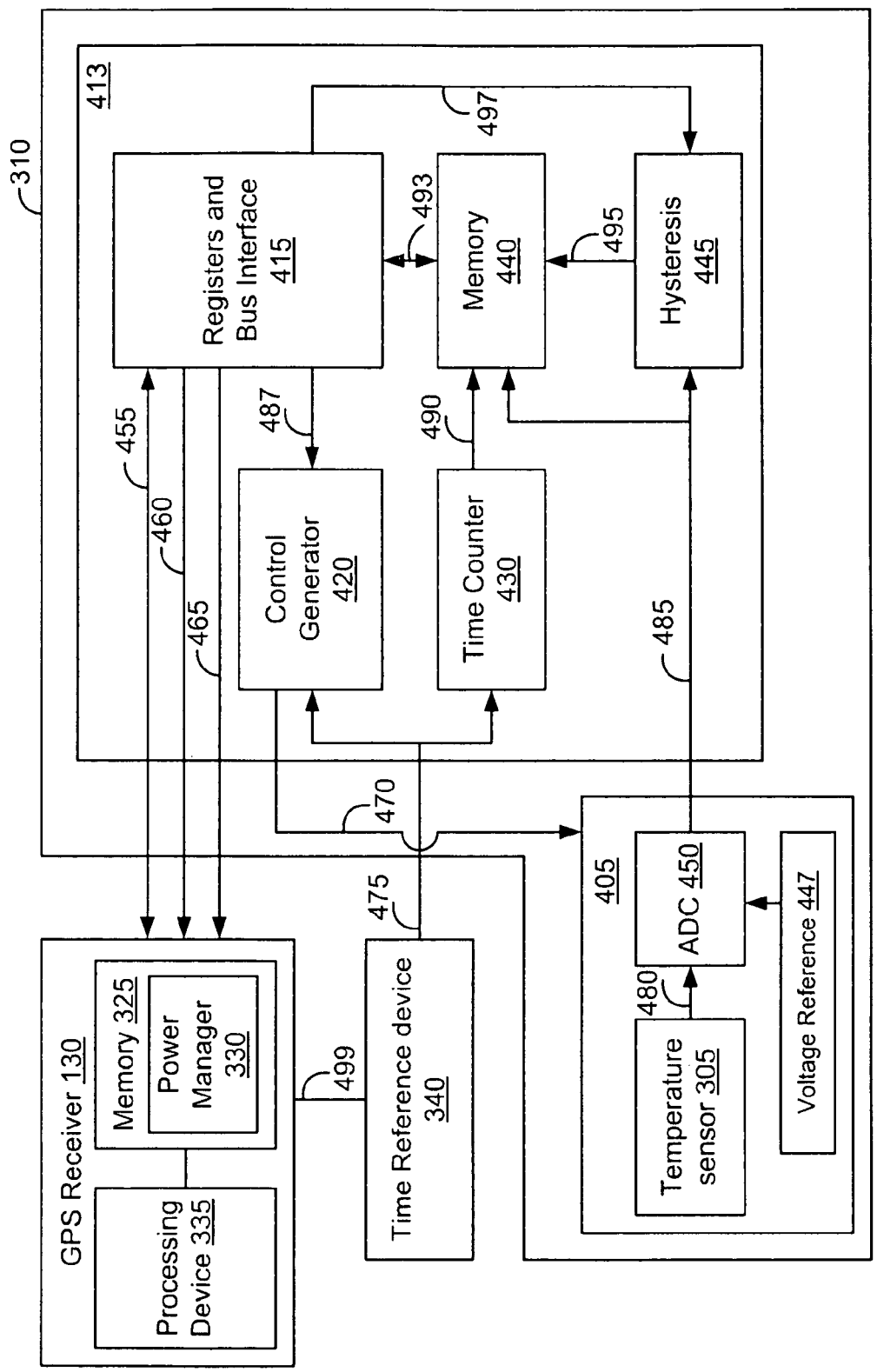
Figure 5:
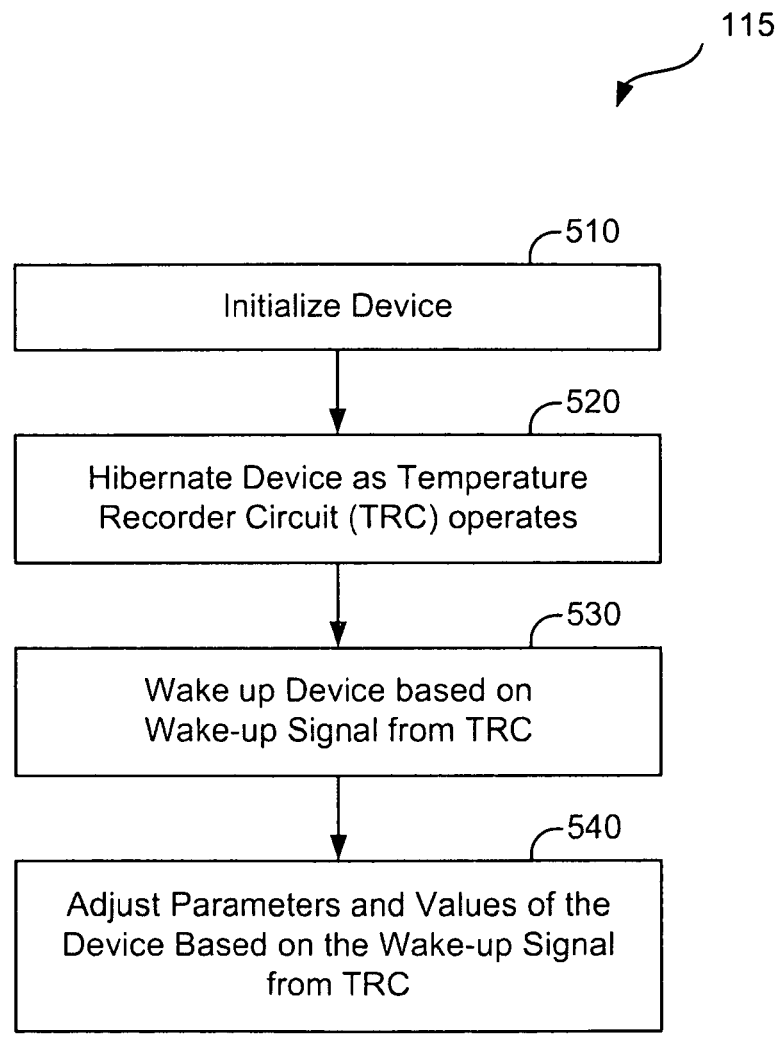

FIG. 4 is a more detailed block diagram that illustrates an embodiment of a temperature recorder circuit, such as that shown in FIG. 3; and FIG. 5 is a high-level flow diagram that illustrates an embodiment of the architecture, functionality, and/or operation of the navigation device 115, such as that shown in FIG. 1, which that manages its power consumption using a temperature recorder circuit and a power manager.

DETAILED DESCRIPTION

Exemplary systems are first discussed with reference to the figures. Although these systems are described in detail, they are provided for purposes of illustration only and various modifications are feasible. After the exemplary systems are described, examples of flow diagrams of the systems are provided to explain the manner in which parameters and values associated with some electrical components of the navigation device can be adjusted while conserving power consumption using a temperature recorder circuit and a power manager.

FIG. 1 is a block diagram that illustrates a system 100 having a global positioning system (GPS) navigation device 115 that improves accuracies of the GPS receiver time and the reference frequency while conserving power consumption using a temperature recorder circuit 310 (FIG. 3) and a power manager 330 (FIG. 3). A simple system 100 includes a plurality of signal sources 105, 110, 113, 114 and a navigation device 115. Alternatively or additionally, a more complex system 100, such as an assisted global positioning system (AGPS), further comprises a base station 120 and a server 125. Although only one navigation device 115, one base station 120, and one server 125 are shown in the system 100, the system 100 can include multiple navigation devices, multiple base stations and/or multiple servers. Alternatively or additionally, the server 125 may be co-located with the base station 120 (e.g., Server Generated Extended Ephemeris) or with the navigation device 115 (e.g., Client Generated Extended Ephemeris).

The signal sources 105, 110, 113, 114 include GPS satellites (also known as space vehicles), among others. The signal sources 105, 110, 113, 114 generally orbit above the location of the navigation devices 115 at any given time. The navigation devices 115 include, but are not limited to, GPS receivers 130, cell phones with embedded signal receivers, and personal digital assistants (PDAs) with embedded signal receivers, among others. The navigation devices 115 further includes a temperature recorder circuit 310 and a power manager 330, both of which are described further in relation to FIGS. 3-5. The signal sources 105, 110, 113, 114 transmit signals to the navigation devices 115, which use the signals to determine the location, speed, and heading of the navigation devices 115.

In an AGPS system, a GPS assistance server 125 assists the navigation devices 115, such as a Mobile Station (MS) client (e.g., a cellular phone) in obtaining a position fix on the client's position. In one embodiment of the AGPS, the MS client 115 sends GPS measurements to the GPS server 125, which then calculates the client's position. For an accurate 3-D position fix the MS client 115 generally receives signals from four satellites 105, 110, 113, 114.

Figure 2:
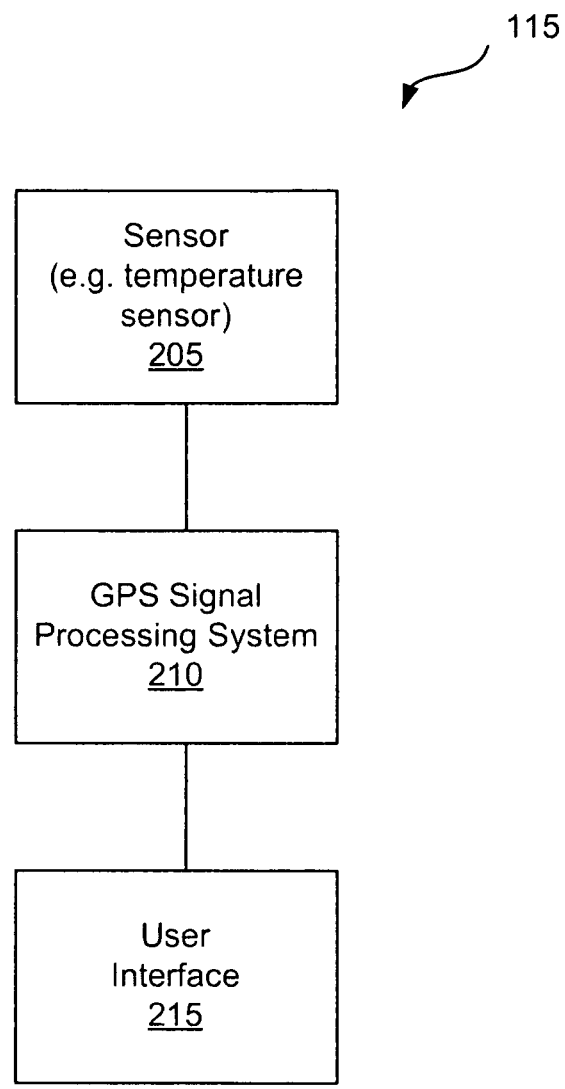
FIG. 2 is a high-level block diagram that illustrates an embodiment of a navigation device, such as that shown in FIG. 1.

FIG. 2 is a high-level block diagram that illustrates an embodiment of a navigation device 115, such as that shown in FIG. 1. The navigation device 115 includes, but is not limited to, sensor(s) 205, a GPS signal processing system 210, and a user interface 215. It should be noted that some sensors 205 may not be included in some navigation devices 115. The sensor 205 can include, but is not limited to, temperature sensors 305 (FIG. 3) and inertial sensors that include, for example, micro-electromechanical system (MEMS) sensors, among others.

The GPS signal processing system 210 can compute position fixes using a current working hypothesis of a location based on prior navigation. The GPS signal processing system 210 obtains at least one GPS range measurement. With at least one range measurement, a timing receiver can update the GPS receiver time and frequency, based on the position hypothesis. If the current position hypothesis is not available, the GPS signal processing system 210 uses at least three (3) and possibly more satellite acquisitions and range measurements to calculate the position fix.

The GPS signal processing system 210 can include, but is not limited to, a GPS receiver 130, a temperature recorder circuit 310 (FIG. 3) and a power manager 330 (FIG. 3), among others. In general, the GPS receiver 130 is capable of computing position fixes. The GPS receiver 130 can be designed to electrically couple to the temperature recorder circuit 310 and the power manager 330, both of which facilitates improving the accuracy of the GPS receiver time and reference frequency while conserving power consumption. The temperature recorder circuit 310 and the power manager 330 are further described in relation to FIG. 3.

FIG. 3 is a block diagram that illustrates an embodiment of a GPS signal processing system 210, such as that shown in FIG. 2, which includes a temperature recorder circuit 310 and a power manager 330. In this example, the GPS signal processing system 210 includes a GPS receiver 130 having memory 325 that contains the power manager 330 and a GPS receiver processing device 335 that executes the power manager 330. The GPS receiver 130 is electrically coupled to the temperature recorder circuit 310, time reference device 340, frequency reference device 350, and sequencer 360, among others.

The time reference device 340 and temperature recorder circuit 310 operate regardless of whether or not the navigation device 115 hibernates. The time reference device 340 generates clock signals while and the temperature recorder circuit 310 receives and operates using the clock signals from the time reference device 340. The temperature recorder circuit 310 is designed to send a wake-up signal to the GPS signal processing system 210, the frequency reference device 350, and other electrical components of the GPS receiver 130 to wake up the GPS receiver 130.

The temperature recorder circuit 310 includes a temperature sensor 305 that senses the temperature of the time reference device 340 and/or a frequency reference device 350 and generates data associated with a temperature change of the time reference device 340 or the frequency reference device 350. In this example, the time reference device 340 and the frequency reference device 350 are shown to be implemented as physically separate devices from the GPS receiver 130, and separate from each other. However, one skilled in the art would appreciate the various combinations of having separate devices or combined devices for the time reference device 340, the frequency reference device 350, and GPS receiver 130.

The temperature sensor 305 can be located, for example, a) on the GPS receiver silicon die 130, b) external to the GPS receiver silicon die 130 on the frequency reference device 350, c) external to the GPS receiver silicon die 130 on the time reference device 340, and d) internal to the temperature recorder 310. It should be noted that although the figures show one temperature sensor 305, one skilled in the art would appreciate using more than one temperature sensors 305 on various electrical components of the navigation device 115. For example, two temperature sensors 305 can be located external to the GPS receiver silicon die 130 each on the frequency reference device 350 and on the time reference device 340. The temperature recorder circuit 310 can measure and store the outputs of one of the two temperature sensors 305, both, or average.

The processing device 335, such as a microprocessor, is coupled to the memory 325 having the power manager 330. The receiver processing device 335 is designed to wake up after receiving the wake-up signal from the temperature recorder circuit 310 and execute instructions associated with the power manager 330. The instructions associated with the power manager 330 include, for example, determining if the temperature recorder circuit 310 sent a wake-up signal and reading the data from the temperature recorder circuit 310. Based on the read data, the power manager 330 adjusts at least one of the following: the time reference device 340, the frequency reference device 350 and the temperature recorder circuit 310, to improve accuracy of the GPS receiver time and reference frequency, and change operation(s) of the temperature recorder circuit 310. Operations of the power manager 330 are further described in FIGS. 4-5.

A sequencer 360 turns on the GPS receiver 130 based on the wake-up signal from the temperature recorder circuit 310. The sequencer 360 can continuously operate regardless of whether the GPS receiver 130 or navigation device 115 hibernates, similar to the temperature recorder circuit 310 and time reference device 340. The sequencer 360 is adjustable and receives configuration parameters from the memory 325 via the power manager 330 and the processing device 335, when the GPS Receiver is awake.

FIG. 4 is a more detailed block diagram that illustrates an embodiment of a temperature recorder circuit 310, such as that shown in FIG. 3. The temperature recorder circuit 310 includes an analog section 405 and a digital section 413. The analog section 405 includes a temperature sensor 305 that is coupled to an analog-to-digital converter (ADC) 450. The temperature sensor 305 senses the temperature of the time reference device 340 or the frequency reference device 350 and generates data associated with a temperature change of the time reference device 340 or the frequency reference device 350 at line 480. The ADC 450 receives the generated data at line 480 from the temperature sensor 305 and converts the data from analog signals to digital signals at line 485.

The temperature sensor 305 can be located on the time and frequency reference device 340, 350, or in close proximity to the time and frequency reference device 340, 350 so that the temperature sensor 305 can accurately measure the temperature of the time and frequency reference device 340, 350. Alternatively there may be two temperature sensors 305 each to measure the time reference device 340 and the frequency reference device 350, using either two ADC's or one ADC with multiplexed input. The temperature sensor 305 and ADC 450 can be designed to measure the temperature of the time and frequency reference device 340, 350 at an update rate, regardless of whether the system is operating or hibernating.

The ADC 450 can be coupled to a switched differential proportional to absolute temperature (PTAT) voltage reference 447 that is designed to be bypassed with switches and fed a constant voltage to the ADC 450. The switched PTAT voltage reference 447 stores the result in memory 440 with a point of pure reference curvature at the applied temperature to correct an $N^{th}$, e.g. $2^{nd}$, order dependence of the switched PTAT voltage reference 447. Alternatively or additionally, the switched PTAT voltage reference 447 is further designed to switch back in and subtract a resulting conversion from the earlier stored code. The switched PTAT voltage reference 447 can repeat the subtraction each time without having to re-compute the pure reference curvature.

A control generator 420 receives clock signals at line 475 from the time reference device 340 and can change a measurement rate of the temperature sensor 305 at line 470 based on the clock signal 475. A time counter 430 also receives the clock signals at line 475 from the time reference device 340 and generates data associated with the GPS receiver time at line 490. The memory 440 of the temperature recorder circuit 310 receives and stores, for example, the GPS receiver time from the time counter 430 at line 490 and sensed temperature data from the ADC 450 at line 485.

A hysteresis circuit 445 receives real-time data associated with the temperature from the ADC 450 at line 485, compares it with the most recent previous temperature from memory 440, and determines whether the memory 440 stores the real-time data at line 485. The hysteresis circuit 445 can instruct the memory 440 at line 495 to store the real-time data at line 485 based on the temperature change. Alternatively or additionally, the hysteresis circuit 445 can be designed to reduce the instances in which electrical circuit noise causes a memory access, rather than a real temperature change. Additionally, the hysteresis circuit 445 is designed to receive a hysteresis threshold, at line 497, from the register and bus interface 415. The hysteresis circuit 445 is further designed to store the current temperature value in memory 440, responsive to any change in temperature exceeding the hysteresis threshold. Storage event can be programmed to cause memory 440 to signal register and bus interface 415 which then executes an interrupt to the GPS receiver 130 if the GPS receiver 130 is powered on or sequencer 360 if the GPS receiver 130 is in hibernate mode.

The time value from the time counter 430 at line 490 is stored in memory 440 to be associated with the stored temperature or implied temperature change. The registers and bus interface 415 receives data from the memory 440 of the temperature recorder circuit 310 or First in First out (FIFO) implemented in memory 440 at line 493.

The registers and bus interface 415 can receive wake up signals from the hysteresis circuit 445 or the memory 440, and send an interrupt signal 460 onward to the GPS receiver 130, based on at least one of the following data: hysteresis threshold exceeded in circuit 445, FIFO level being exceeded in memory 440, the memory 440 being full, sensed temperature, data associated with the GPS receiver time, or temperature change. The processing device 335 generally has access through the memory 440 of the temperature recorder circuit 310 to the receiver time and temperature that caused the event. Alternatively or addition, if the option for receiver time alone is meant to imply a wake alarm from the time reference device 340, the GPS receiver 130 can be configured to be able to distinguish the time alarm, so that appropriate action can be taken.

Alternatively or additionally, the FIFO fill depth can be set by a processing device 335 so that the wake-up signal can be sent before memory 440 is actually full. As such, the temperature recorder circuit 310 can wake up the GPS receiver 130 or navigation device 115 at or before a certain temperature change has occurred. The temperature change may be less, but not more than the temperature change implied by the fill level. If the FIFO uses the memory 440 with write and read pointers, then the FIFO generally triggers the empty signal or the full signal when a read pointer points to a write pointer address or the write pointer points to the read pointer address, respectively.

The registers and bus interface 415 communicates configuration commands and/or data between the memory 325 and the processing device 335. The registers and bus interface 415 facilitates initialization of the temperature recorder circuit 310 by, for example, sending initialization data at line 487 to the control generator 420. The initialization data includes, but is not limited to, control enable instruction, warm-up period instruction, and temperature recorder circuit 310 enable instruction, among others. It should be noted that a temperature recorder circuit 310 that has a fixed and unchangable configuration may not need any initialization.

In this example, the processing device 335 of the GPS receiver 130 communicates with the temperature recorder circuit 310 using the interface bus at line 455. The processing device 335 of the GPS receiver 130 is electrically coupled to the time reference device 340 to receive the clock signals at line 499. The clock signal at line 475 runs the time counter 430 that has stored receiver time while the navigation system 115 was off. This receiver time is the local estimate of GPS system time and is used to initialized the receiver timing to allow more rapid acquisition of GPS signals. Once acquired, the GPS signals are used to make pseudo-range measurements (e.g., range measurements biased by the error in the local receiver time relative to true GPS system time) from the GPS receiver 130 to the several satellites 105, 110, 113, 114. These measurements are then used to calculate the position and time error by the processing device 335 at the GPS receiver 130. It should be noted that the temperature recorder circuit 310 can be coupled with any electrical components of the GPS receiver 130 or navigation device 115 and can wake up the GPS receiver 130 or other devices.

FIG. 5 is a flow diagram that illustrates an embodiment of the architecture, functionality, and/or operation of the navigation device 115, such as that shown in FIG. 1, which manages its power consumption using a temperature recorder circuit 310 and a power manager. Beginning with steps 510 and 520, the navigation device 115 initializes the electrical components of the navigation device 115 and can be configured to hibernate as the temperature recorder circuit 310 and time reference device 340 operates. In step 530, the temperature recorder circuit 310 sends a wake-up signal to some electrical components of the navigation device 115, waking up the electrical components. In step 530 and 540, the power manager 330 receives the wake-up signal and other data from the temperature recorder circuit 310 and adjusts parameters and values associated with some electrical components of the navigation device 115 based on the received wake-up signal and data. The electrical components can include, but are not limited to, the time reference device 340, the frequency reference device 350 and the temperature recorder circuit 310.

The systems and methods disclosed herein can be implemented in software, hardware, or a combination thereof. In some embodiments, the system and/or method is implemented in software that is stored in a memory and that is executed by a suitable microprocessor (μP) situated in a computing device. However, the systems and methods can be embodied in any computer-readable medium for use by or in connection with an instruction execution system, apparatus, or device. Such instruction execution systems include any computer-based system, processor-containing system, or other system that can fetch and execute the instructions from the instruction execution system. In the context of this disclosure, a "computer-readable medium" can be any means that can contain, store, communicate, propagate, or transport the program for use by, or in connection with, the instruction execution system. The computer readable medium can be, for example, but not limited to, a system or propagation medium that is based on electronic, magnetic, optical, electromagnetic, infrared, or semiconductor technology.

Specific examples of a computer-readable medium using electronic technology would include (but are not limited to) the following: an electrical connection (electronic) having one or more wires; a random access memory (RAM); a read-only memory (ROM); an erasable programmable read-only memory (EPROM or Flash memory); magneto-resistive random access memory (MRAM). A specific example using magnetic technology includes (but is not limited to) a portable computer diskette. Specific examples using optical technology include (but are not limited to) optical fiber and compact disc read-only memory (CD-ROM).

Note that the computer-readable medium could even be paper or another suitable medium on which the program is printed. Using such a medium, the program can be electronically captured (using, for instance, optical scanning of the paper or other medium), compiled, interpreted or otherwise processed in a suitable manner, and then stored in a computer memory. In addition, the scope of the certain embodiments of the present disclosure includes embodying the functionality of the preferred embodiments of the present disclosure in logic embodied in hardware or software-configured mediums.

It should be noted that any process descriptions or blocks in flowcharts should be understood as representing modules, segments, or portions of code which include one or more executable instructions for implementing specific logical functions or steps in the process. As would be understood by those of ordinary skill in the art of the software development, alternate embodiments are also included within the scope of the disclosure. In these alternate embodiments, functions may be executed out of order from that shown or discussed, including substantially concurrently or in reverse order, depending on the functionality involved.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

The invention claimed is:

1. A receiver comprising:
   real time clock (RTC) oscillator that generates clock signals while a receiver hibernates; and
   a temperature recorder circuit that receives and operates using the clock signals from the RTC oscillator while the receiver hibernates, the temperature recorder circuit being designed to send a wake-up signal to at least one electrical component of the receiver to wake up the electrical component of the receiver.

2. The receiver as defined in claim 1, wherein the temperature recorder circuit includes at least one temperature sensor that performs at least one of the following: sense the temperature of the RTC oscillator or a frequency reference device, and generate data associated with a temperature change of the RTC oscillator or the frequency reference device.

3. The receiver as defined in claim 2, wherein the at least one temperature sensor is located: a) on a GPS receiver silicon die, b) external to the GPS receiver silicon die on the frequency reference device, c) external to the GPS receiver silicon die on the RTC oscillator, or d) internal to the temperature recorder.

4. The receiver as defined in claim 3, wherein two temperature sensors are located external to the GPS receiver silicon die each on the frequency reference device and on the time reference device, the temperature recorder circuit being designed to measure and store the outputs of one of the two temperature sensors, both, or average.

5. The receiver as defined in claim 2, wherein the temperature recorder circuit further includes a control generator that changes a measurement rate of the temperature sensor.

6. The receiver as defined in claim 2, wherein the temperature recorder circuit further includes an analog-to-digital converter (ADC) that converts the sensed temperature and the data associated with the temperature change from analog signals to digital signals.

7. The receiver as defined in claim 2, wherein the temperature recorder circuit further includes: a time counter that receives the clock signals from the RTC oscillator and generates data associated with GPS receiver time; and memory that stores data associated with the GPS receiver time and sensed temperature.

8. The receiver as defined claim 1, further comprising a second memory that is coupled to a GPS receiver microprocessor, the second memory including a power manager that has instructions, the GPS receiver microprocessor being designed to wake up and process the instructions, the instructions associated with the power manager including the following logics:
query data from a memory of the temperature recorder circuit, and
adjust parameters and values associated with some electrical components of the navigation device based on the received wake-up signal and queried data.

9. The receiver as defined claim 8, further comprising a sequencer that turns on the electrical component of the receiver based on the wake-up signal from the temperature recorder circuit.

10. The receiver as defined in claim 8, wherein the time reference device and the temperature recorder circuit operate regardless of whether the receiver is hibernating or not.

11. A receiver comprising:
real time clock (RTC) oscillator that generates clock signals while a receiver hibernates; and
a temperature recorder circuit that receives and operates using the clock signals from the RTC oscillator while the receiver hibernates, the temperature recorder circuit being designed to send a wake-up signal to at least one electrical component of the receiver to wake up the electrical component of the receiver, wherein the temperature recorder circuit includes at least one temperature sensor that performs at least one of the following: sense the temperature of the RTC oscillator or a frequency reference device, and generate data associated with a temperature change of the RTC oscillator or the frequency reference device, wherein the temperature recorder circuit further includes an analog-to-digital converter (ADC) that converts the sensed temperature and the data associated with the temperature change from analog signals to digital signals, wherein the temperature recorder circuit further includes a switched differential proportional to absolute temperature (PTAT) voltage reference that is designed to be bypassed with switches and feed a constant voltage to the ADC and store a result in memory with a point of pure reference curvature at an applied temperature to correct the 2nd order dependence of the ADC voltage reference.

12. The receiver as defined in claim 11, wherein the switched PTAT voltage reference is further designed to switch back in and subtract a resulting conversion from an earlier stored code, the switched PTAT voltage reference being further design to repeat the subtraction each time without having to re-compute the pure reference curvature.

13. A receiver comprising:
real time clock (RTC) oscillator that generates clock signals while a receiver hibernates; and
a temperature recorder circuit that receives and operates using the clock signals from the RTC oscillator while the receiver hibernates, the temperature recorder circuit being designed to send a wake-up signal to at least one electrical component of the receiver to wake up the electrical component of the receiver, wherein the temperature recorder circuit further includes: a time counter that receives the clock signals from the RTC oscillator and generates data associated with GPS receiver time and memory that stores data associated with the GPS receiver time and sensed temperature, wherein the temperature recorder circuit further includes a hysteresis circuit that receives the data associated with the temperature change and determines whether the memory stores the data associated with the temperature change, the hysteresis circuit being designed to reduce instances in which electrical circuit noise causes a memory access, rather than a real temperature change.

14. The receiver as defined in claim 13, wherein the hysteresis circuit sends instructions to the memory to store the data associated with the temperature change if the temperature changed.

15. The receiver as defined in claim 13, wherein the hysteresis circuit is designed to include a hysteresis threshold, and a fill level value, the hysteresis circuit being further designed to wake up the electrical component of the receiver based on either the hysteresis threshold or the fill level value, or both, the hysteresis threshold and the fill level value being set by a processing device.

16. The receiver as defined in claim 13, wherein the temperature recorder circuit includes a register and bus interface that receives data from the memory of the temperature recorder circuit.

17. The receiver as defined in claim 16, wherein the register and bus interface receives a wake up signal based on the received data from the memory of the temperature recorder circuit.

18. The receiver as defined in claim 16, wherein the register and bus interface facilitates initialization of the temperature recorder circuit.

19. The receiver as defined in claim 16, wherein responsive to the registers and bus interface determining that the memory is full, the registers and bus interface sends the wake-up signal to a processor or a sequencer if the processor is hibernating.

20. A temperature recorder circuit comprising:
a real time clock (RTC) oscillator that generates clock signals while a receiver hibernates;
at least one temperature sensor that senses the temperature of the RTC oscillator or a frequency reference device and generates data associated with a temperature change of the RTC oscillator or the frequency reference device;
a time counter that receives the clock signals from the RTC oscillator and generates data associated with GPS receiver time;
memory that stores the sensed temperature and the data associated with the GPS receiver time;
a registers and bus interface that communicates configuration commands and/or data between the memory and a processing device of a receiver; and
logic circuitry that sends a wake-up signal to at least one electrical component of the receiver based on the received data from the memory.

21. The temperature recorder circuit as defined in claim 20, further comprising a control generator that changes a measurement rate of the temperature sensor.

22. The temperature recorder circuit as defined in claim 20, further comprising a hysteresis circuit that receives data associated with the temperature change and determines whether the memory stores the data associated with the temperature change, the hysteresis circuit being designed to reduce instances in which electrical circuit noise causes a memory access, rather than a real temperature change.

23. A system comprising:
real time clock (RTC) oscillator that generates clock signals while the system hibernates; and
a temperature recorder circuit that receives and operates using the clock signals from the RTC oscillator while the system hibernates, the temperature recorder circuit being designed to send a wake-up signal to at least one electrical component of the system.

24. The system as defined in claim 23, wherein the electrical component of the system includes at least one of the following: a global positioning system (GPS) receiver, a processing device, and a frequency reference device.

25. The system as defined in claim 23, wherein the RTC oscillator and the temperature recorder circuit operate whether or not any of the electrical components of the system is hibernating.

* * * * *